United States Patent [19]
Olsen

[11] Patent Number: 5,450,000
[45] Date of Patent: Sep. 12, 1995

[54] USING HALL DEVICE FOR CONTROLLING CURRENT IN A SWITCHMODE CIRCUIT

[75] Inventor: Stuart W. Olsen, Edmonton, Canada

[73] Assignee: Unity Power Corporation, Edmonton, Canada

[21] Appl. No.: 195,286

[22] Filed: Feb. 14, 1994

[51] Int. Cl.$^6$ .................. G05F 1/10; G01R 33/00
[52] U.S. Cl. .................. 323/222; 323/282; 324/117 H
[58] Field of Search ........... 323/222, 282, 294, 259, 323/344; 324/127, 117 R, 117 H

[56] References Cited

U.S. PATENT DOCUMENTS

| | | | |
|---|---|---|---|
| 2,928,048 | 3/1960 | Postal | 324/99 |
| 3,099,792 | 7/1963 | Leger, Jr. | 323/94 |
| 3,189,815 | 6/1965 | Barabutes et al. | 323/120 |
| 3,317,835 | 5/1967 | Dietz et al. | 324/117 |
| 3,370,246 | 2/1968 | O'Brien | 330/102 |
| 3,443,234 | 5/1969 | Bizet | 330/6 |
| 3,525,041 | 8/1970 | Velsink | 324/117 |
| 3,573,616 | 4/1971 | Kahen | 324/117 |
| 3,974,425 | 8/1976 | Ueda et al. | 317/123 |
| 4,059,798 | 11/1977 | Dierker et al. | 324/117 |
| 4,199,696 | 4/1980 | Tanaka et al. | 307/309 |
| 4,283,643 | 8/1981 | Levin | 307/309 |
| 4,443,716 | 4/1984 | Avery | 307/309 |
| 4,616,188 | 10/1986 | Stitt et al. | 330/6 |
| 4,639,665 | 1/1987 | Gary | 324/117 H |
| 4,663,699 | 5/1987 | Wilkinson | 363/17 |
| 4,682,101 | 7/1987 | Cattaneo | 324/117 H |
| 4,914,376 | 4/1990 | Meyer | 323/352 |
| 4,939,448 | 7/1990 | Gudel | 324/117 R |
| 4,939,449 | 7/1990 | Cattaneo et al. | 324/117 R |
| 4,947,108 | 8/1990 | Gudel | 324/117 R |
| 5,004,974 | 4/1991 | Cattaneo et al. | 324/117 R |
| 5,146,156 | 9/1992 | Marcel | 324/117 |

OTHER PUBLICATIONS

Micro Linear Application Note 11, Power Factor Enhancement Circuit; Mehmet K. Nalbant, Copyright 1993 Micro Linear Corp., p. 1 of 2, 2/9–9/9, Jun. 1993.
A Three—Phase PWM Strategy Using a Stepped Reference Waveform, John. C. Salmon, Member, IEEE, Stuart Olsen, Student Member, IEEE, and Nelson Durdle, Member, IEEE, IEEE Transactions on Industry Applications, vol. 27, No. 5, Sep./Oct. 1991, pp. 914–920.
Micro Linear ML4812, Jul. 1992 Prelilminary, Power Factor Cokntrokller, Copyright 1993 Micro Linear Corp., p. 14.
Integrated Circuits Unitrode, UC1854, Uc2854, UC3854, High Power Factor Preregulator, copyright 1993 Unitrode, p. 8.
Power Factor Correction with the UC3854 by Claudio de Sa E Silva, Senior Applications Engineer Unitrode Integrated Circuits Corp. Copyright 1993 Unitrode p. 10.

*Primary Examiner*—Steven L. Stephan
*Assistant Examiner*—E. To
*Attorney, Agent, or Firm*—Anthony R. Lambert

[57] ABSTRACT

A current controller for controlling an input current carried by a primary conductor. The current controller has a gapped core of magnetic material magnetically coupled to the primary conductor, as for example by the primary conductor being wound around the core. A secondary conductor is magnetically coupled to the core of magnetic material in an opposite manner to the primary conductor such that current flowing in the secondary conductor generates a second magnetic field in the core opposed to the first magnetic field. A Hall effect latch is located in the air gap and has output voltage corresponding to a hysteresis function of the difference in the first and second magnetic fields.

4 Claims, 6 Drawing Sheets

USING HALL DEVICE FOR CONTROLLING CURRENT IN A SWITCHMODE CIRCUIT

FIELD OF THE INVENTION

This invention relates to current controllers, particularly current controllers for boost converters.

BACKGROUND AND SUMMARY OF THE INVENTION

While the present invention has application to various electronic devices requiring current control, the advantages of the operation of the invention will be well understood from a description of its operation with boost converters. For this reason, a brief discussion of the operation of prior art boost converters will facilitate the understanding of the invention.

FIG. 1 shows an electrical schematic of a prior art power electronic circuit for a power factor corrected boost converter. A boost converter takes an input DC voltage $V_{in}$ and produces an output DC voltage $V_{out}$ having a higher voltage level. As illustrated in FIG. 1, $V_{in}$ input to boost converter 10 is the rectified output from diode bridge 12, which is supplied power from an alternating voltage source 14. Within the boost converter 10, $V_{in}$ is applied to one end of an inductor L1 whose output is connected to diode D1 and power electronic switch IGBT. A capacitor C1 is shunted across the output of the diode and $V_{out}$ is taken from point 16. The power electronic switch IGBT, placed in series with $V_{in}$ and L1 when IGBT is closed, is controlled by gate drive 18, and controls the current through the inductor L1. A control signal is provided to gate drive 18 to control the switch IGBT.

The operation of the boost converter 10 is as follows. The power electronic switch IGBT is turned on by gate drive 18, which causes current to flow through the switch as indicated by the arrow A, and inductor L1 is impressed with $V_{in}$. The current through inductor L1 gradually increases in response to $V_{in}$ at a rate that is determined by $V_{in} = L1 * di/dt$ and the magnetic field of the inductor becomes charged due to the increasing current. The switch IGBT is then turned off by gate drive 18, causing diode D1 to conduct. The inductor L1 then discharges into the capacitor C1 through diode D1, charging the capacitor C1. Output voltage 16 may be taken off the circuit between diode D1 and capacitor C1.

The power electronic switch IGBT is controlled independently of the input voltage $V_{in}$ and thus the input current entering the boost converter may be controlled by control of the switch IGBT. If $V_{in}$ is full wave rectified AC, then the gate control signal may be selected to produce a desired input current waveform matching the input voltage and thereby having unity power factor.

The waveform of the input current is illustrated in FIG. 2b, while the gate control voltage is shown in FIG. 2a. When the gate voltage is high, the switch IGBT is closed, allowing current to increase in the inductor(as shown at 19a). The input current to the boost converter, measured at current sensor 3 thus rises while the switch IGBT is closed. The current continues to rise until the switch IGBT is opened when the gate voltage switches to low. The current then decreases (as shown at 19b) as the inductor discharges through D1 into C1. As can be seen from FIGS. 2a and 2b, in the early part of the cycle, the gate voltage is high longer than it is low, and thus the current rises more than it falls. With appropriate choice of the pulse widths of the gate voltage, a desired current waveform may be produced. A simulated sinewave SS is shown in FIG. 2b, with the current bounded by an upper hysteresis limit UHL and a lower hysteresis limit LHL.

The manner of selection of the prior art gate control pulsed waveform is indicated in the electrical schematic of FIGS. 3A, 3B, 3C, 3D and 3E. The ac voltage produced by the utility from which the power is drawn is sampled by $V_{ac}$ sensor 1, also shown in FIG. 1. FIG. 3B shows the voltage waveform appearing at B in FIG. 3A. This voltage is rectified in rectifier 22 to produce a half-wave rectified sine wave signal C (illustrated in FIG. 3C). The actual output voltage is sensed at $V_{dc}$ sensor 2 and compared with desired $V_{dc}$ using amplifier 24 to produce output signal F which represents the deviation of the DC output from a desired $V_{dc}$. $V_{dc}$ is a constant that is determined by the end use requirements. Signal C and Signal F are multiplied in multiplier 26 to establish a desired current waveform designated as signal G. Signal G is compared with a voltage representation of the current signal E (FIG. 3E) sensed at current sensor 3 using hysteresis comparator 28 and the output of comparator 28 signal D (FIG. 3D) is used as the control signal for the gate drive 18. If the actual current waveform exceeds the desired current waveform (signal G) by more than a set amount, the comparator will generate a control signal which, while on, will cause the current in inductor L1 to decrease. When the actual current waveform is below the desired current waveform by more than a set amount, the comparator will generate a control signal which, while on, will cause the current in inductor L1 to increase. For the gate drive 18 and switch IGBT shown, the current increase signal closes the switch IGBT, while the current decrease signal opens the switch IGBT. This hysteresis loop is continuous and maintains the input current waveform closely tied (within a hysteresis deadband) to the input voltage waveform.

The inventor is aware of three custom chips that provide the control outlined in FIGS. 1, 2a, 2b and 3, namely UC3854 provided by Unitrode Integrated Circuits Corporation of Merrimack, NH, USA; ML4812 provided by Micro Linear Corp of San Jose, Calif., USA and LT1248 provided by Linear Technology Corporation of Milipitas, Calif., USA. These chips periodically set the gate control and reset when the current reaches the required value. The circuitry illustrated in FIG. 3 is contained within an integrated circuit, and receives input from various sensors referred to there. Further description of these products can be found in the product monographs provided by these companies.

The inventor has provided a new way of providing the gate control for a boost converter, but the invention also may be applied to control voltage and current in other switch mode circuit applications, such as flyback and buck converters. The circuit is simpler than the integrated circuits known to the inventor, much less expensive, and requires less filtering to remove the ripple generated by the switching of the switch IGBT.

Thus in one embodiment of the invention there is provided a current controller for controlling an input current carried by a primary conductor, the current controller comprising a gapped core of magnetic material magnetically coupled to the primary conductor, as for example by the primary conductor being wound around the core, a secondary conductor magnetically connected to the core of magnetic material in an opposite manner to the primary conductor such that current flowing in the secondary conductor generates a second magnetic field in the core opposed to the first magnetic field; and a Hall effect latch located in the air gap and having output voltage corresponding to a hysteresis function of the difference in the first and second magnetic fields.

An example of a hysteresis function for the voltage is a function in which the voltage can take on one of two different levels for any given value or level of the magnetic field between an operate point and a release point. In effect, the voltage may have a defined level while the magnetic field is rising between two magnetic field levels, and a different defined level when the magnetic field is falling between two magnetic field levels.

Such a current controller has particular application for use with a boost converter having a gate drive in which the output of the Hall effect latch is connected to the gate drive. The secondary conductor is preferably connected to a desired current waveform generator and is wound around the core a number of times.

The Hall effect latch preferably includes a Hall effect device, an amplifier connected to the Hall effect device, and a hysteresis comparator connected to the output of the amplifier.

BRIEF DESCRIPTION OF THE DRAWINGS

There will now be described preferred embodiments of the invention, with reference to the drawings, by way of illustration, in which like numerals denote like elements and in which.

DETAILED DESCRIPTION OF PREFERRED EMBODIMENTS

Figure 1:
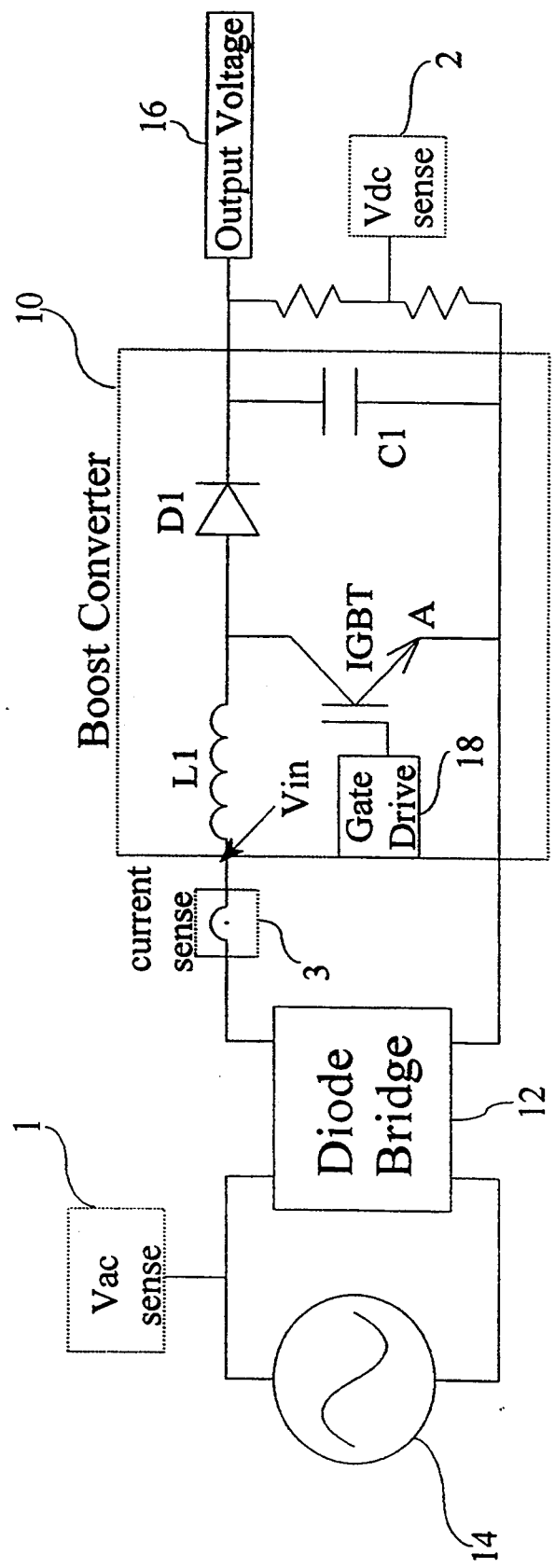
FIGS. 1, 2a, 2b, and 3a–3e are prior art figures.
Figure 4:
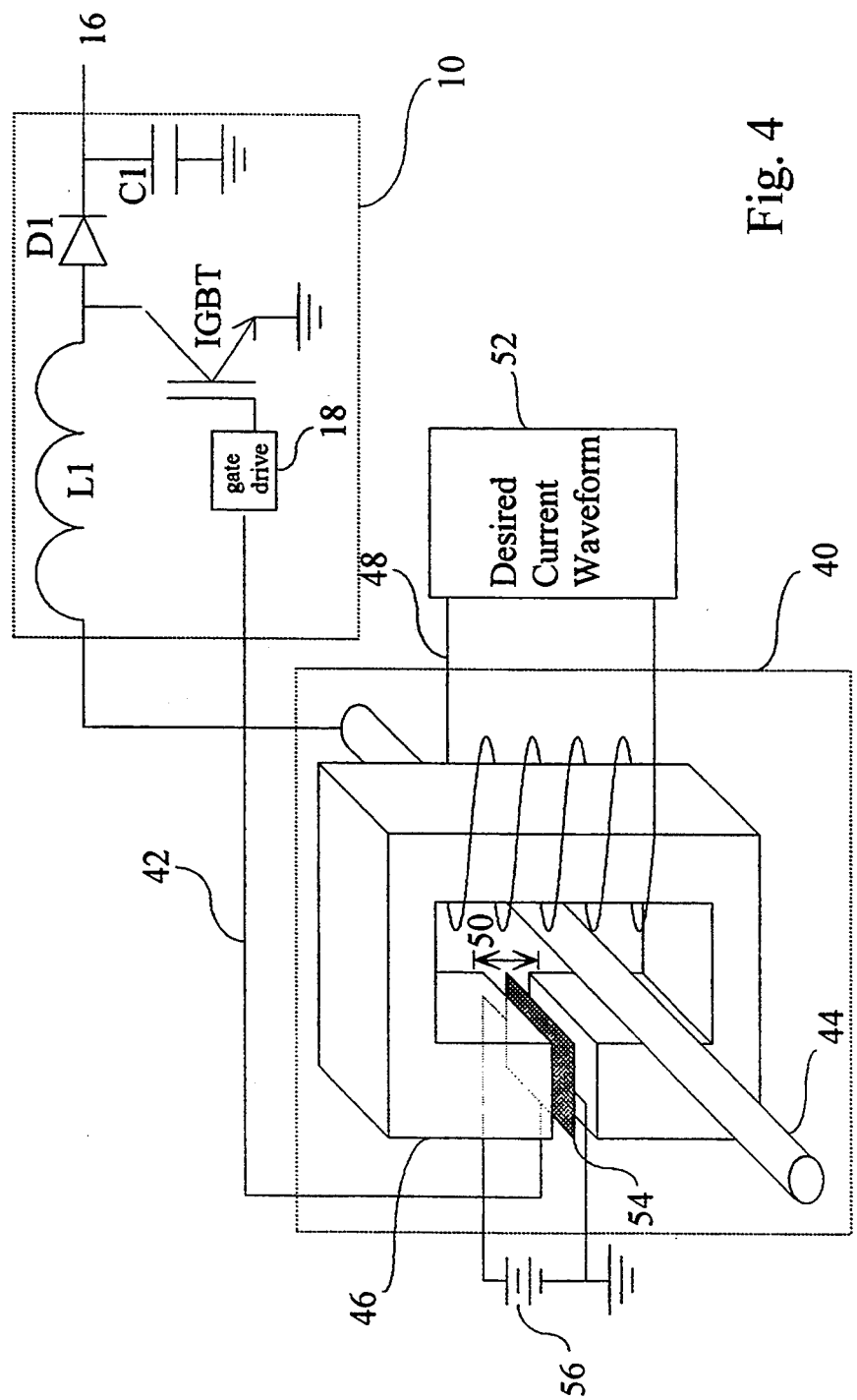
FIG. 4 is an electrical schematic of an embodiment of the current controller according to the present invention

Referring to FIG. 4, there is shown a boost converter 10, formed of inductor L1, diode D1, capacitor C1, switch IGBT and gate drive 18. Output voltage is taken at 16 from the boost converter 10. The boost converter itself works in similar manner to the boost converter shown in FIG. 1.

An exemplary current controller 40 made in accordance with the principles of the invention supplies a gate control signal along line 42 to gate drive 18. The current controller 40 controls the current flowing in primary conductor 44. Current in primary conductor 44 is provided to the inductor L1.

The current controller 40 includes a core 46 of magnetic material magnetically coupled to the primary conductor 44. In the example shown the core 46 surrounds the primary conductor 44, to enhance the magnetic coupling, and the primary conductor 44 could be wound around the core 46 several times depending on the degree of magnetic coupling required. Input current passing through the primary conductor 44 generates a magnetic field in the core 46.

A secondary conductor 48 is magnetically connected to the core 46 in an opposite manner to the primary conductor 44 such that current flowing in the secondary conductor 48 generates a magnetic field in the core 46 opposed to the magnetic field generated by the primary conductor 44. The secondary conductor 48 is wound around the core a desired number of times (it may for example simply pass through the core like the primary conductor shown) and is supplied with current from a desired waveform generator 52. In the case of power factor control for a boost converter, the desired waveform signal will have a current much lower than the value of the current flowing in the primary conductor 44. Therefore to compare the magnetic fields generated by the primary and secondary conductors the number of windings in the secondary conductor 48 should be a multiple, say X, of the number of windings in the primary conductor 44, where X equals the ratio between the RMS value of the current flowing in the primary conductor divided by the RMS value of the current flowing in the secondary conductor. If it is intended to have the flow of current in the primary conductor mimic the flow of current in the secondary conductor (in which case the values are comparable) then X should be 1, and both conductors could simply pass through the core 46, or in other words the primary and secondary conductors are magnetically coupled to the core to the same degree. However, in the general case, since control of a larger current signal with a smaller current signal is desired, the number of turns in the primary and secondary will differ.

Figure 5:
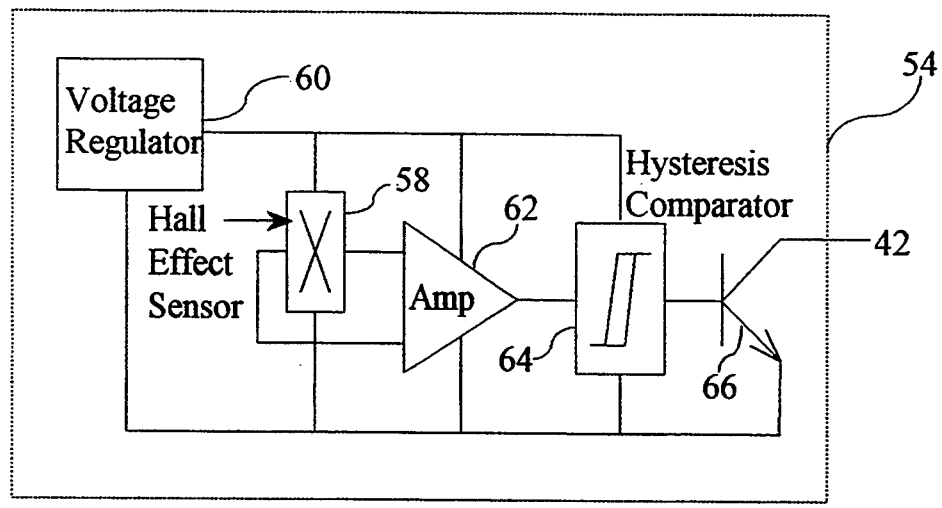
FIG. 5 is an electrical schematic of a Hall effect latch for use with the invention shown in FIG. 4.

The core 46 includes an air gap 50 or the equivalent, and a Hall effect latch 54 is located in the air gap. The Hall effect latch has output voltage corresponding to a hysteresis function of the difference in the magnetic fields. The construction of the Hall effect latch 54 is best illustrated in Fig. 5. A Hall effect sensor 58, having an output voltage proportional to the magnetic field passing through the sensor (that is, the magnetic field in the gap 50), is supplied operating voltage from external voltage source 56, which is regulated with voltage regulator 60. The output of the Hall effect sensor 58 is amplified by amplifier 62 and passed to hysteresis comparator 64. The output of the hysteresis comparator 64 is supplied to the base of transistor 66 whose collector is connected to gate drive 18 via line 42, with any suitable required buffering as desired (such as an opto-isolator).

Figure 2A:
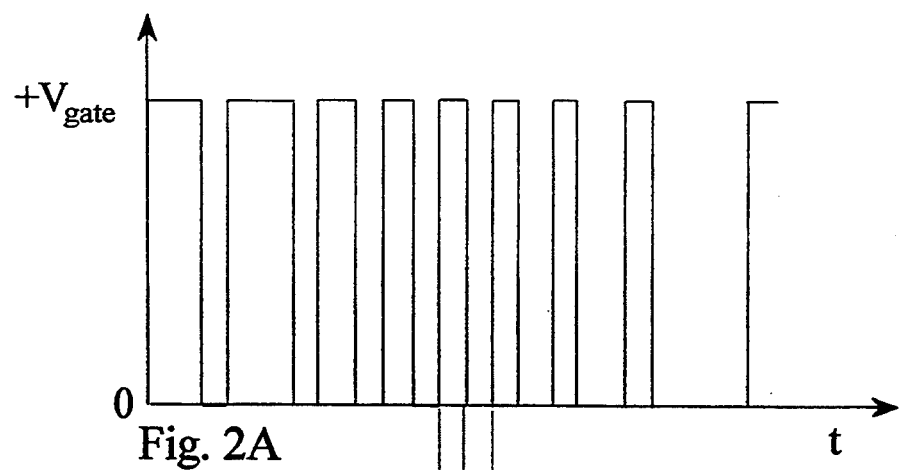
Figure 2B:
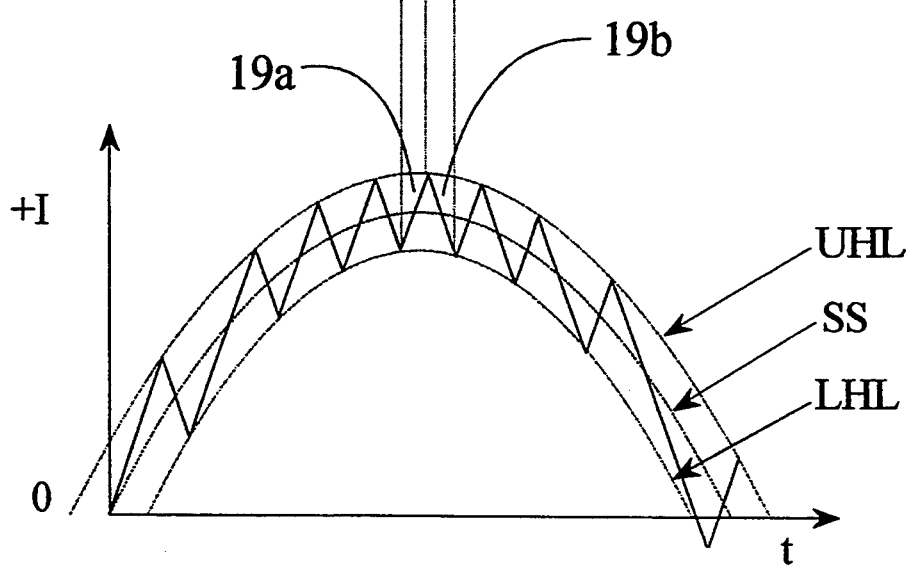
Figure 3A:
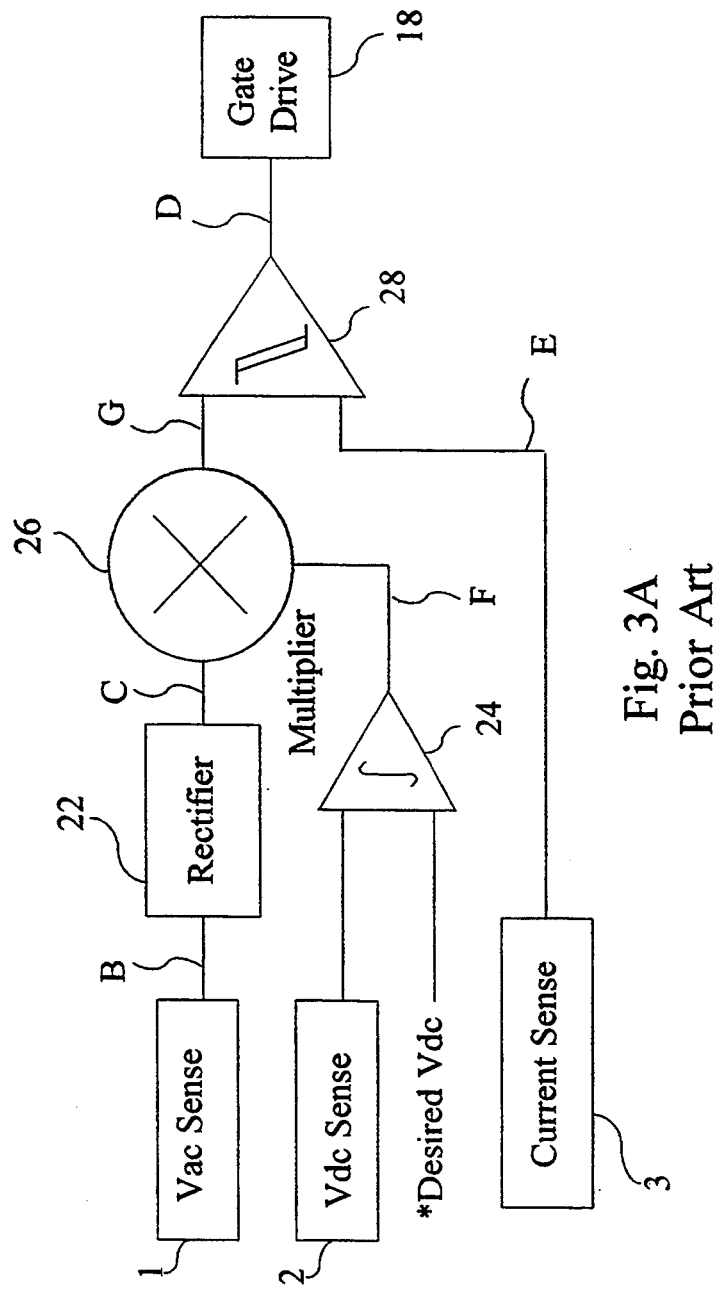
Figure 3B:
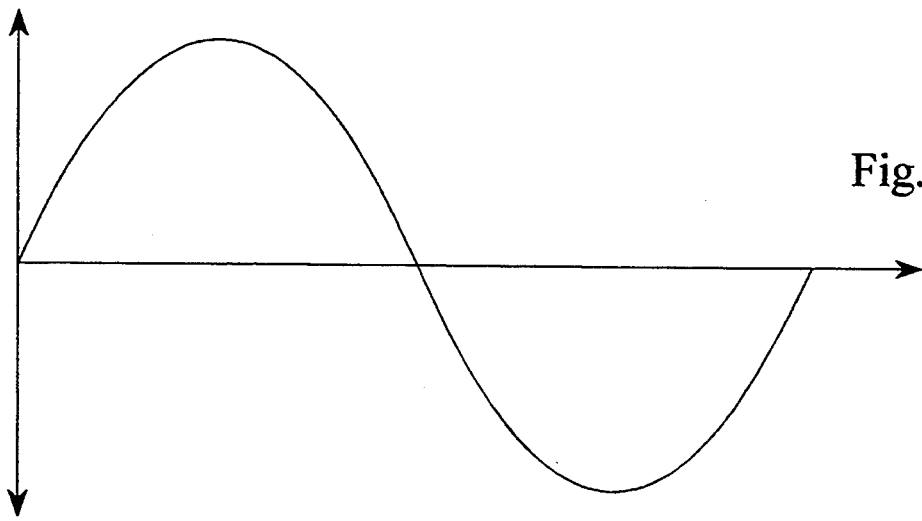
Figure 3C:
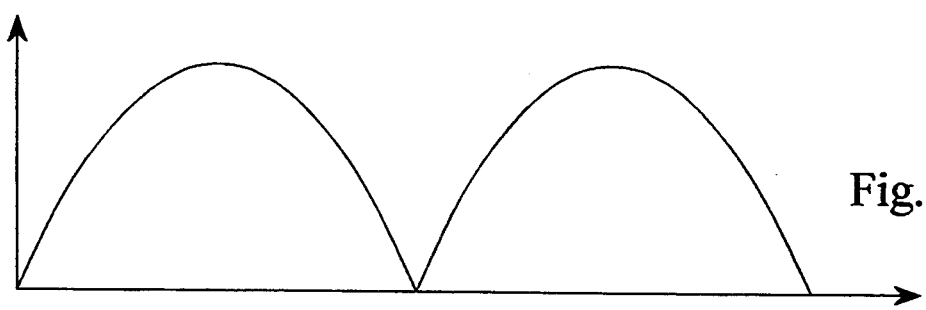
Figure 3D:
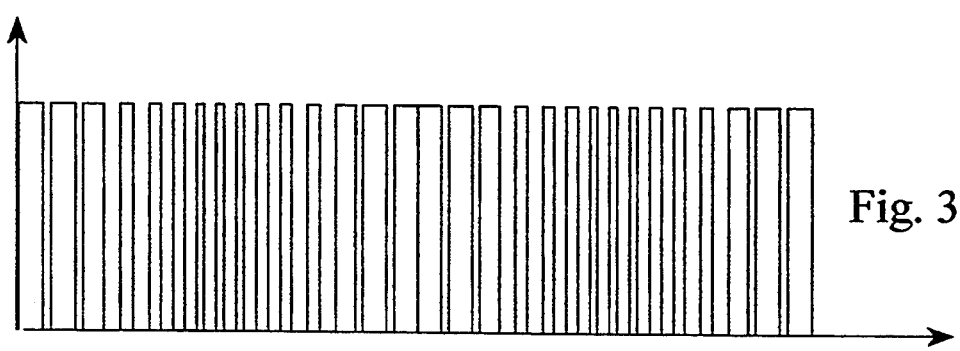
Figure 3E:
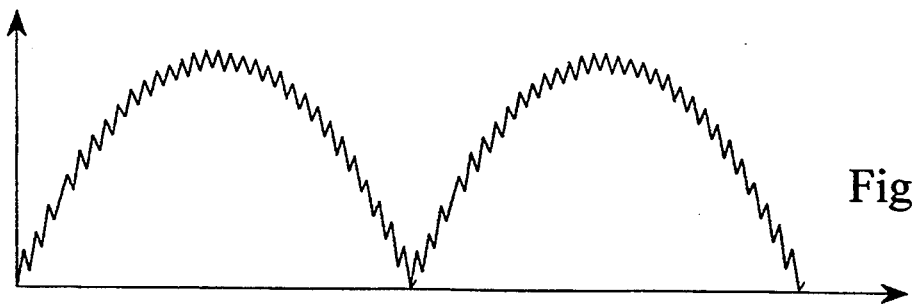
Figure 6:
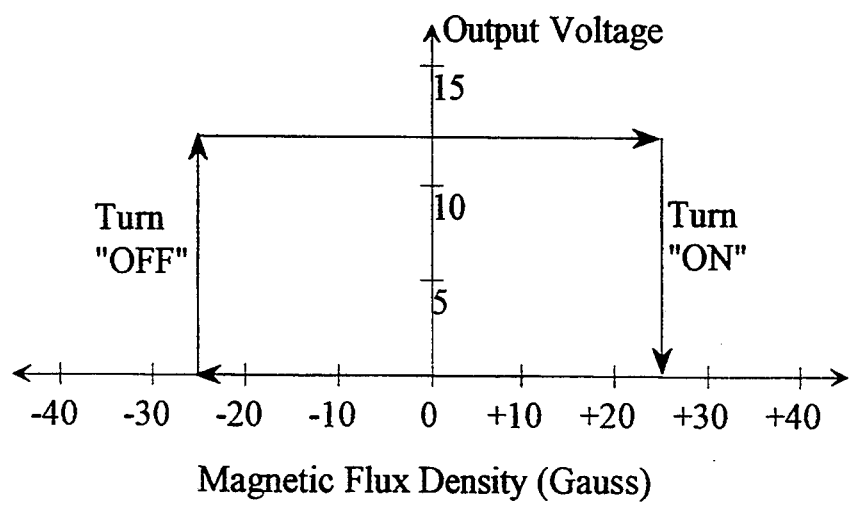
FIG. 6 is a graph showing a hysteresis function corresponding to the output of the Hall effect latch.

FIG. 6 illustrates the function of the Hall effect latch 54. The x-axis shows the magnetic flux density in the air gap, which is a function of the difference of the currents flowing in the secondary conductor and the primary conductor. The y-axis shows the output voltage of the Hall effect latch. When the flux density in the air gap reaches a first value (operate point, 25 gauss is illustrated), the hysteresis comparator 64 turns on, sending a constant signal to the gate drive 18. This signal turns the IGBT off and causes the input (primary) current to decrease. The constant signal remains on until the flux density reaches a second value (release point, -25 gauss is illustrated), upon which the IGBT turns on causing the input (primary) current to increase, thereby moving towards the first value (operate point) again. This cycle repeats to produce the waveform illustrated in FIGS. 2a and 2b. The longer the flux density takes to go from the first value to the second, the longer the control signal is applied.

In operation, the core senses the difference between the input current waveform drawn from the alternating voltage source 14 and the desired current waveform produced by the generator 52, and produces a difference signal corresponding to the difference between the input current waveform and the desired current waveform. The Hall effect latch 54 generates a control signal corresponding to a hysteresis function of the difference signal, and the control signal is supplied to the switch control (gate drive 18) of switch IGBT. The switch IGBT switches on and off to cause the current to increase and decrease within the hysteresis deadband, resulting in the current illustrated in FIG. 2.

The current controller of the present invention may also be used in flyback converters and buck converters. The flyback converter is similar to the boost converter illustrated in FIG. 4 except that the diode is reversed and the switch IGBT and inductor L1 reverse their positions. The buck converter is also similar to the boost converter illustrated in FIG. 4, except the switch IGBT in the buck converter is in the place of the inductor L1 of the boost converter, the inductor L1 in the buck converter is in the place of the diode in the boost converter and the diode in the buck converter is in the place of the switch IGBT in the boost converter.

In a preferred implementation of the invention, the operate point may be +10 gauss with a release point of −10 gauss, and the magnetic circuit may have magnetic coupling of 5 gauss per amp turn. If the desired ripple current peak to peak is 2 amps, then the number of turns on the primary conductor is calculated as the operate point (10 gauss) divided by the product of half the peak to peak desired ripple current (1 amp) and the magnetic coupling factor (5 gauss per amp turn), yielding 2 primary turns. The number of turns on the secondary winding depends on the current supplied by the desired current waveform circuit 52 as discussed previously and in the case where the desired current waveform has an RMS current of 0.01 amp, and the primary has 1 amp and two turns then the number of turns of the secondary conductor is 200.

A person skilled in the art could make immaterial modifications to the invention described and claimed in this patent without departing from the essence of the invention.

The embodiments of the invention in which an exclusive property of privilege is claimed are defined as follows:

1. A method of controlling an input current having an input current waveform drawn from a voltage source using a reference current having a reference current waveform, the method comprising the steps of:

sensing the difference between the flux generated by the input current in a magnetic material and the flux generated by the reference current in the magnetic material;

producing a difference signal corresponding to the difference between flux generated by the input current and the flux generated by the reference current;

generating a control signal corresponding to a hysteresis function of the difference signal, the hysteresis function having a hysteresis band;

supplying the control signal to a switch control; and ramping the input current up and down under control of the switch control to maintain the difference between the input waveform and the reference current waveform within the hysteresis band.

2. The method of claim 1 further including amplifying the difference signal before generating the control signal.

3. Apparatus for controlling an input current having an input current waveform drawn from a voltage source using a reference current having a reference current waveform, the apparatus comprising:

means for sensing the difference between the flux generated by the input current in a magnetic material and the flux generated by the reference current in the magnetic material;

means for producing a difference signal corresponding to the difference between flux generated by the input current and the flux generated by the reference current;

means for generating a control signal corresponding to a hysteresis function of the difference signal, the hysteresis function having a hysteresis band;

means for supplying the control signal to a switch control; and means for ramping the input current up and down under control of the switch control to maintain the difference between the input waveform and the reference current waveform within the hysteresis band.

4. The apparatus of claim 3 further including means for amplifying the difference signal before generating the control signal.

* * * * *